United States Patent
Hintermaier et al.

(10) Patent No.: US 6,500,489 B1
(45) Date of Patent: *Dec. 31, 2002

(54) LOW TEMPERATURE CVD PROCESSES FOR PREPARING FERROELECTRIC FILMS USING BI ALCOXIDES

(75) Inventors: Frank S. Hintermaier, Munich (DE); Peter C. Van Buskirk, Newtown, CT (US); Jeffrey F. Roeder, Brookfield, CT (US); Bryan C. Hendrix, Danbury, CT (US); Thomas H. Baum, New Fairfield, CT (US); Debra A. Desrochers, Monroe, CT (US)

(73) Assignees: Advanced Technology Materials, Inc., Danbury, CT (US); Infineon Technologies Corporation, Cupertino, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/208,541

(22) Filed: Dec. 9, 1998

Related U.S. Application Data

(63) Continuation-in-part of application No. 08/975,087, filed on Nov. 17, 1997, now Pat. No. 6,303,391, and a continuation-in-part of application No. 08/758,599, filed on Nov. 27, 1996, now Pat. No. 6,133,051.

(51) Int. Cl.$^7$ ............................................... C23C 16/40
(52) U.S. Cl. ........................... 427/255.31; 427/255.32; 427/314; 427/372.2
(58) Field of Search .................. 427/255.31, 255.32, 427/576, 248.1, 314, 81, 372.2

(56) References Cited

U.S. PATENT DOCUMENTS

| | | | |
|---|---|---|---|
| 5,478,610 A | | 12/1995 | Desu et al. |
| 5,523,284 A | * | 6/1996 | Fagan, Jr. et al. ............ 427/62 |
| 5,527,567 A | | 6/1996 | Desu et al. |
| 5,612,082 A | | 3/1997 | Azuma et al. |
| 5,876,503 A | * | 3/1999 | Roeder et al. ............... 118/715 |
| 5,902,639 A | * | 5/1999 | Glassman et al. ........ 427/248.1 |
| 5,925,183 A | * | 7/1999 | Kato et al. .............. 106/287.18 |
| 5,980,983 A | * | 11/1999 | Gordon ....................... 427/226 |
| 6,004,392 A | * | 12/1999 | Isobe et al. ..................... 117/88 |
| 6,010,744 A | * | 1/2000 | Buskirk et al. ................ 427/81 |
| 6,110,531 A | | 8/2000 | de Araujo et al. |
| 6,120,846 A | * | 9/2000 | Hintermaier et al. .... 427/248.1 |
| 6,133,051 A | * | 10/2000 | Hintermaier et al. .......... 438/3 |
| 6,214,105 B1 | * | 4/2001 | Hintermaier et al. .... 427/248.1 |

FOREIGN PATENT DOCUMENTS

| | | |
|---|---|---|
| EP | 125507 | 11/1984 |
| EP | 747937 | 11/1996 |
| EP | 747938 | 11/1996 |
| EP | 766319 | 4/1997 |
| EP | 795898 | 9/1997 |
| EP | 807965 | 11/1997 |
| EP | 849780 | 6/1998 |
| EP | 878837 | 11/1998 |
| JP | 9067197 | 4/1995 |
| JP | 8277197 | 8/1995 |
| JP | 8339716 | 8/1995 |
| JP | 9077592 | 9/1995 |
| WO | WO 95/02897 | 1/1995 |
| WO | 96/40690 | 12/1996 |
| WO | 99/32685 | 7/1999 |

OTHER PUBLICATIONS

T. Li, et al., "The microstructure and properties for layered oxide thin films fabricated by MOCVD" Mat. Res. Soc. Symp. Proc. vol. 415 [1996], p. 189.

T. Li et al., "Metalorganic chemical vapor deposition of ferroelectric SrBi$_2$Ta$_2$O$_9$", Appl. Phys. Lett. 68(5) [1996], p. 616.

T. Ami et al., "Preparation and properties of ferroelectric Bi$_2$SrTa$_2$O thin films for FeRAM using flash–MOCVD" Mat. Res. Soc. Symp. Proc. vol. 415, [1995], p. 195.

C. Isobe et al., "Characteristics of ferroelectric SrBi$_2$Ta$_2$O$_9$ thin films grown by flash MMOCVD", Integrated Ferroelectrics, vol. 14, pp. 95–103 [1997].

R. Gardiner et al., "Liquid delivery of low vapor pressure MOCVD precursors", Mat. Res. Soc. Symp. Proc. 335, 221, [1994].

Van Buskirk et al., "Plasma–enhanced metalorganic chemical vapor deposition of BaTiO$_3$ films" J. Vac. Sci. Tech. A, 10(4). 1578 [1992].

T. Nakamura et al., "Preparation of Bi$_4$Ti$_3$O$_{12}$ Films by MOCVD and their application to memory devices", Integrated Ferroelectrics, vol. 6, pp. 35–46, [1995].

Clegg et al, "X–ray Crystal Structure of [Bi(NMe$_2$)$_3$]", Inorganic Chemistry, vol. 30 (24), pp. 4680–4682 [1991].

K. Yoshimura et al, "Preparation of ferroelectric Bi$_4$Ti$_3$O$_{12}$ thin films with c–axis orientation by atmospheric pressure metal organic chemical vapor deposition" Jpn. J. Appl. Phys. vol. 34, [1995], pp. 2425–2429.

(List continued on next page.)

Primary Examiner—Bret Chen
(74) Attorney, Agent, or Firm—Margaret Chappuis

(57) ABSTRACT

Chemical vapor deposition is used to form a film of Bi oxide, Sr oxide, and Ta oxide on a heated substrate by decomposing the precursors of these oxides at the surface of the substrate. The precursor of Bi oxide is a Bi complex which includes at least one alkoxide group and is decomposed and deposited at a temperature lower than 450° C. The film of Bi, Sr, and Ta oxides obtained by low-temperature CVD is predominantly non-ferroelectric, but can be converted into a ferroelectric film by a subsequent heating process.

77 Claims, 5 Drawing Sheets

OTHER PUBLICATIONS

Y. Okuhara et al., "Development of new Ferrolectric Source Materials for MOCVD and MOD" Int. Symp. For Int. Ferroelectrics, Mar. 1997, Book of Abstracts, 133i, 9th International Symposium on Integrated Ferroelectrics. No page numbers.

G. Lucovsky et al., "Deposition of silicon dioxide and silicon nitride by remote plasma enhanced chemical vapor deposition", J. Vac. Sci. Tech. A, 4, 681, [1996].

A.P. Pisarevski et al., "Bismuth Carboxylates", Inorg. Chem 35(6), p. 84 (1990).

W.A. Hermann et al., Chem. Ber. 126, p. 1127 (1993) [English Abstract Only].

R.G. Goel et al., "Organobismuth compounds The Preparation and structural characteristics of triphenylbismuth(V) compounds containing a Bi–O–Bi Bond.", J. Organomet. Chem. 36, p. 323 (1972).

Kojima et al., "Measurements of vapor pressures of MOCVD materials, which are usable for ferroelectric thin films", Integrated Ferroelectrics, 18, p. 183 (1997).

H. Suzuki et al, "Ultrasonic reaction of triarylbismuthines and tri arylstibines with Iodosylbenzene. Mild oxidizing ability of the organobismuth oxide function for organic substrates." Tetrahedron Letters, vol. 35, No. 44 [1994], pp. 8197–8200.

W.A. Hermann et al, "Volatile Metal Alkoxoides according to the concept of donor functionalization" Angewandte Chemie, vol. 34, 1995, pp. 2187–2206.

* cited by examiner

LOW TEMPERATURE CVD PROCESSES FOR PREPARING FERROELECTRIC FILMS USING BI ALCOXIDES

CROSS REFERENCE TO RELATED APPLICATIONS

This application is a continuation-in-part of U.S. patent application Ser. No. 08/975,087, filed Nov. 17, 1997, entitled "Low Temperature Chemical Vapor Deposition Process for Forming Bismuth-Containing Thin Films Useful in Ferroelectric Memory Devices", now U.S. Pat. No. 6,303,391 and a continuation-in-part of U.S. patent application Ser. No. 08/758,599, filed Nov. 27, 1996, entitled "Multiple Vaporizer Reagent Supply System for Chemical Vapor Deposition Utilizing Dissimilar Precursor Compositions", now U.S. Pat. No. 6,133,051.

This application is related to applications: U.S. Ser. No. 09/208542, filed Dec. 9, 1998, entitled "Low Temperature CVD processes for preparing ferroelectric films using Bi amides", now U.S. Pat. No. 6,177,135; U.S. Ser. No. 09/208,544, filed Dec. 9, 1998, entitled "Low Temperature CVD processes for preparing ferroelectric films using Bi aryls", now abandoned; and U.S. Ser. No. 09/208,543, filed Dec. 9, 1998, entitled "Low Temperature CVD processes for preparing ferroelectric films using Bi carboxylates", now U.S. Pat. No. 6,180,420.

BACKGROUND OF THE INVENTION

This invention relates to chemical vapor deposition methods for providing a Bi oxide-containing film on a surface of a substrate by decomposing a precursor of Bi oxide.

Interest in ferroelectric has increased in recent years, due to the utility of these materials in applications such as non-volatile memories. Information in these memories is stored by the polarization of a thin ferroelectric film which is placed between the two plates of a capacitor. The capacitor is connected to a transistor to form a storage cell, which controls the access of read-out electronics to the capacitor.

The information stored in the cell can be changed by applying an electric field to the thin ferroelectric film and flipping the polarization. Ferroelectric random access memories (FERAMs), unlike DRAMs (dynamic random access memories), retain the stored information if the power supply is turned off. In addition, they do not require refresh cycles. Desirable electrical properties for ferroelectrics used in memory applications include: (a) a low coercive field, which makes the use of as low a voltage supply as possible; (b) a high remanent polarization, which is needed for high reliability of information storage; (c) minimal fatigue, which is required for a long life-time; and (d) no imprint, as an imprint would alter the stored information.

Strontium bismuth tantalate ($SrBi_2Ta_2O_9$) (SBT) is a ferroelectric material that meets all of these requirements. Significant efforts are therefore being made to integrate this material into memory devices. Capacitors in which SBT is incorporated using a sol-gel method have good electrical properties. The sol-gel method provides only a low integration density of SBT, however. To achieve a higher integration density of SBT, an alternative method, such as chemical vapor deposition (CVD), must be used.

SUMMARY OF THE INVENTION

In one aspect, the invention features a method of forming a Bi-containing metal oxide film on a substrate, by dissolving a precursor of Bi oxide in a solution, decomposing the precursor to form Bi oxide, and depositing the Bi oxide on the substrate at a temperature lower than 450° C. Bi complexes which include at least one alkoxide group are used as the precursor of Bi oxide.

Embodiments of this aspect of the invention may include one or more of the following features.

The deposition temperature may be lower than 400° C. The Bi oxide-containing film may also be provided by adding the steps of decomposing a precursor of Sr oxide, and a precursor of Ta oxide to form Sr oxide and Ta oxide, respectively, and depositing the Bi oxide, the Sr oxide and the Ta oxide on the substrate.

The film of Bi, Sr, and Ta oxides may be deposited as a ferroelectric film or can be converted into a ferroelectric film by an annealing process.

In accordance with the invention, the ferroelectric layer is formed from an amorphous as-deposited layer or film. The amorphous film is annealed, transforming it into the ferroelectric layer. We have discovered that by forming the ferroelectric layer from an amorphous layer, a lower thermal budget is consumed by the ferro-anneal as compared to that of ferroelectric layer formed from conventional techniques. The lower thermal budget avoids or reduces excessive diffusion of one or more of the constituents of the ferroelectric layer and oxidation of the contacts.

The amorphous layer is processed to produce a ferroelectric layer in accordance with the invention. The amorphous layer comprises materials that can be transformed into a ferroelectric layer. In one embodiment, the amorphous layer comprises a Bi-based oxide ceramic. The Bi-based oxide ceramic comprises, for example, strontium bismuth tantalate (SBT) or a material derived from SBT (SBT derivative). The amorphous layer is annealed under appropriate conditions transforming it into a ferroelectric layer.

The amorphous film comprises a material which can be processed, for example by a ferro-anneal, to form a ferroelectric film. In one embodiment, the amorphous layer comprises a metal oxide ceramic material. Preferably, the amorphous layer comprises a Bi-based oxide ceramic material. More preferably, the amorphous layer comprises a Bi-based oxide ceramic material that can be processed to transform it into a ferroelectric.

The Bi-containing metal oxide film is formed by placing the substrate in a CVD chamber, heating the substrate to a deposition temperature lower than 450° C., introducing vapors of the precursors of Bi, Sr, and Ta oxides to the CVD chamber, decomposing the precursors of Bi, Sr, and Ta oxides, and depositing the oxides on the substrate. Precursors of Bi, Sr, and Ta oxides may be decomposed in the presence of an oxidizer by oxidative decomposition, where examples of the oxidizers include $O_2$, singlet $O_2$, $O_3$, $H_2O_2$, $N_2O$, $NO_x$ ($1 \leq x \leq 3$), and downstream oxygen plasma, and where the concentration of the oxidizer is between 5% and 95% of the total gas and vapor flow into the CVD chamber. At least one of $O_2$ and $N_2O$ may be used as the oxidizer. The oxidizer may be formed in the CVD chamber by converting an oxidizer molecule into an active oxidizer by applying to the CVD chamber plasma, UV light, heat, a sensitizer, or ion beams.

The precursor of Bi oxide may have the formula $Bi(OR)_3$, $Bi(OR)_2(OR')$, or $Bi(OR)(OR')(OR'')$, where each of R, R', and R'' is, independently, an alkyl, aryl, or silyl group. For example, R may be $^t$pentyl, pentyl, $^t$Bu, Bu, $^i$Pr, Pr, Et, Me, Ph, aryl, or $SiR'''_3$, and R''' may be $^t$Bu, Bu, $^i$Pr, Pr, Et, or Me. Examples of precursors of Bi oxide further include $Bi(O^tBu)_3$ and $Bi(OCMe_2Et)_3$. The precursor of Bi oxide may also include an alkoxy group, a phenoxy group, or a donor atom such as N, O, or S. For example, the precursor may include the group —$CH_2CH_2$—$N(CH_3)_2$.

The Bi-containing metal oxide deposited on the substrate may have the formula $(Bi_2O_2)^{2+}(A_{m-1}B_mO_{3m+1})^{2-}$, where A is $Bi^{3+}$, $L^{3+}$, $L^{2+}$, $Ca^{2+}$, $Sr^{2+}$, $Ba^{2+}$, $Pb^{2+}$, or $Na^+$, B is $Fe^{3+}$, $Al^{3+}$, $Sc^{3+}$, $Y^{3+}$, $L^{3+}$, $L^{4+}$, $Ti^{4+}$, $Nb^{5+}$, $Ta^{5+}$, $W^{6+}$, or $Mo^{6+}$, and L is $Ce^{4+}$, $La^{3+}$, $Pr^{3+}$, $Ho^{3+}$, $Eu^{2+}$, or $Yb^{2+}$, and where $1 \leq m \leq 5$. The Bi-containing metal oxide may also have the formula $Bi_2WO_6$; $BiMO_3$, where M is Fe or Mn; $Ba_2BiMO_6$, where M is V, Nb or Ta; $Pb_2BiMO_6$, where M is V, Nb or Ta; $Ba_3Bi_2MO_9$, where M is Mo or W; $Pb_3Bi_2MO_9$, where M is Mo or W; $Ba_6BiMO_{18}$, where M is Mo or W; $Pb_6BiMO_{18}$, where M is Mo or W; $KBiTi_2O_6$; or $K_2BiNb_5O_{15}$. These metal oxides can be obtained by decomposing precursors which contain the above-described metals.

The Bi-containing metal oxide film can also be a SBT derivative. Examples of such derivatives include $SrBi_2Ta_2O_9$; $SrBi_2Ta_{2-x}Nb_xO_9$, where $0 \leq x \leq 2$; $SrBi_2Nb_2O_9$; $Sr_{1-x}Ba_xBi_2Ta_{2-y}Nb_yO_9$, where $0 \leq x \leq 1$ and $0 \leq y \leq 2$; $Sr_{1-x}Ca_xBi_2Ta_{2-y}Nb_yO_9$ where $0 \leq x \leq 1$ and $0 \leq y \leq 2$; $Sr_{1-x}Pb_xBi_2Ta_{2-y}Nb_yO_9$, where $0 \leq x \leq 1$ and $0 \leq y \leq 2$; and $Sr_{1-x-y-z}Ba_xCa_yPb_zBi_2Ta_{2-p}Nb_pO_9$, where $0 \leq x \leq 1$, $0 \leq y \leq 1$, $0 \leq z \leq 1$, and $0 \leq p \leq 2$. An element of the metal oxide may be substituted by a metal such as Ce, La, Pr, Ho, Eu, and Yb.

The precursor of Sr oxide generally has the formula $Sr(thd)_2$ or $Sr(thd)_2$ adduct, and may include a polyether or a polyamine. The polyether has the formula R—O—$(CH_2CH_2O)_n$—R', where $2 \leq n \leq 6$, and where each of R and R' may be, independently, an alkyl group, an aryl group, or hydrogen. The polyamine has the formula R—NR"-$(CH_2CH_2NR")_n$-R', where $2 \leq n \leq 6$, where each of R and R' may be, independently, an alkyl group, an aryl group, or hydrogen, and where R" is H, Me, Et, or Pr. The precursor of Sr oxide may also include tetraglyme, triglyme, N,N,N', N",N"-pentamethyl-diethylene-triamine, or N,N,N',N",N''', N'''-hexamethyl-triethylene-tetramine. The precursor of Sr oxide may also be Sr alkoxide, SR alkoxide mixed with Ta and Nb alkoxides, or a Lewis base adduct of the alkoxide, where the Lewis base is tetraglyme, triglyme, N,N,N',N", N"-pentamethyl-diethylene-triamine, or N,N,N',N",N''',N'''-hexamethyl-triethyleneetramine.

The precursor of Ta oxide generally has the formula $Ta(OR)_{5-n}(X)_n$, where R is Me, Et, Pr, $^iPr$, Bu, $^iBu$, $^tBu$, pentyl, or $^tpentyl$, where X is β-diketonate, and where $1 \leq n \leq 5$. For example precursor may be $Ta(O^iPr)_4(thd)$. The precursor of Ta oxide may be an alkoxide including Ta pentakis (ethoxide), Ta pentakis ($^ipropoxide$), Ta pentakis ($^tbutoxide$), or Ta pentakis ($^tpentoxide$).

The precursors of the Bi, Sr, and Ta oxides are dissolved in a solution of an aliphatic, a cycloaliphatic, or an aromatic solvent that may include a functional group such as an alcohol, ether, ester, amine, ketone, or aldehyde group. For example, the precursors of Bi, Sr, and Ta oxides may be dissolved in a solvent such as an alcohol. For example, t-butanol may be used as a solvent for $Bi(O^tBu)_3$, and t-pentanol for $Bi(OCMe_2Et)_3$. Alternatively, the precursors may be dissolved in a mixture of THF, $^iPrOH$, and a Lewis base in a ratio of about 8:2:1, respectively, or a mixture of octane, decane, and pentamethyl-diethylene-triamine in a ratio of about 5:4:1. Furthermore, the precursor of Bi oxide may be dissolved in a solution comprising Lewis base adducts.

The solutions containing the precursors are evaporated by vaporizers. For example, the solution containing the precursor of Bi oxide is evaporated at a temperature from 130° C. to 220° C., and the solution for the precursors of Sr and Ta oxides is evaporated at a temperature from 170° C. to 240° C. An inert gas such as Ar, He, or $N_2$ is added to the vapors of the solution, and a mixture of the inert gas and vapors is delivered to the CVD chamber. For example, the mixture includes vapors of the precursors of Bi oxide, Sr oxide, and Ta oxide in a ratio of about 2:1:2. It is appreciated that the concentrations of the precursors in the vapor mixture depend on several factors, including vaporization temperature, pressure in the vaporizer, gas and vapor flow rate, desired film stoichiometry, and geometry of the CVD chamber.

In the CVD chamber, the substrate is heated to the deposition temperature of 300° C. to 450° C. The pressure in the CVD chamber is maintained between 0.001 torr and 760 torr, for example, between 0.1 torr and 10 torr. An additional inert gas is added to the CVD chamber, where the concentration of the inert gas may vary from 10% to 90% of the total gas and vapor flow into the CVD chamber, for example, 30% to 50%. Preferably, the vapors of the precursors, the oxidizers, and an inert gas are introduced to the CVD chamber at a total flow rate of 1 ml/min to 15,000 ml/min, measured at the standard condition. The desirable flow rate may also depend on the temperature and the pressure of the gas and vapor mixture, desired film stoichiometry, and geometry of the CVD chamber. The oxides are deposited onto the substrate over a time period between 2 minutes and 2 hours, for example, between 2 minutes and 15 minutes. After deposition, the film is heated to a temperature of 600° C. to 800° C. for a time period between 5 minutes and 3 hours.

The substrate preferably includes Si, n-doped Si, n-doped Si, $SiO_2$, $Si_3N_4$, GaAs, MgO, $Al_2O_3$, $ZrO_2$, $SrTiO_3$, $BaTiO_3$, or $PbTiO_3$. The film of Bi-containing metal oxide is deposited on a bottom electrode disposed on the substrate which includes a transistor. The bottom electrode is connected to the transistor by a plug. The bottom electrode may include a metal such as Pt, Pd, Au, Ir, or Rh; a conducting metal oxide such as $IrO_x$, $RhO_x$, $RuO_x$, $OsO_x$, $ReO_x$, or $WO_x$, where $0 \leq x \leq 2$; a conducting metal nitride such as $TiN_x$, $ZrN_x$, or $WN_yTaN_y$, where $0 \leq x \leq 1.0$ and $0 \leq y \leq 1.7$; or a superconducting oxide such as $YBa_2Cu_3O_{7-x}$ where $0 \leq x \leq 1$, and $Bi_2Sr_2Ca_2Cu_3O_{10}$. The bottom electrode may be a Pt electrode.

A first intermediate layer may be provided between the bottom electrode and the plug. Examples of the first intermediate layer include a Ti adhesion layer and a Ti nitride diffusion barrier layer. A second intermediate layer may also be provided between the bottom electrode and the metal oxide layer. Examples of the second intermediate layer include a seed layer, a conducting layer, and a dielectric layer of high permittivity. The plug may include W or Si, and is connected to the bottom electrode and to a source/drain of a MOS field effect transistor. The film may also be used as a thin ferroelectric film for a ferroelectric capacitor, a ferroelectric memory, and/or a ferroelectric field effect transistor, for example, a metal ferroelectric semiconductor and a metal ferroelectric insulating semiconductor.

The substrate may be flushed with a mixture of an inert gas and the oxidizer before and/or after being exposed to the vapors of the precursors of the metal oxides. The processes of heating, decomposing, and depositing may be performed at least twice on the substrate. The substrate may also be removed from the chamber, treated by at least one intermediate process, such as a rapid thermal process, and returned to the chamber.

The operating conditions of the CVD may also be changed. For example, the compositions of the precursors, oxidizers, and inert gas in the mixture may be varied while the substrate is positioned in the chamber. Deposition temperature as well as the chamber pressure may also be varied. The precursor of Bi oxide may be delivered to the CVD chamber during a period between the onset of deposition and 30 minutes thereafter; the concentration of the Bi oxide is then decreased. In other methods, the substrate may be heated inside the chamber at a temperature lower than 450° C. at least twice, or the substrate may be heated inside the chamber at a temperature lower than 450° C. in the presence of at least one of the oxidizers $O_2$ and $O_3$.

In another aspect, the invention features a method of forming a metal oxide film on a substrate, by heating the substrate to a temperature lower than 450° C. and introducing vapors of a precursor of Bi oxide to the substrate. Bi complexes which include at least one alkoxide group are used as the precursors of Bi oxide. The precursor of Bi oxide decomposes at the surface of the substrate to form Bi oxide, which is deposited on the surface of the substrate.

As used herein, the term "precursor of Bi oxide" means any Bi complex which may be degraded to form Bi oxide. Examples of precursors of Bi oxide include Bi alkoxides, which have the structure $Bi(OR)_3$, $Bi(OR)_2(OR')$ or $Bi(OR)(OR')(OR'')$, where each of R, R', and R" is, independently, an alkyl or an aryl group. Bi alkoxides also include derivatives of the above-described precursors.

The use of Bi alkoxides as the precursors of Bi oxide in chemical vapor deposition offers numerous advantages. Bi alkoxides contain Bi—O bonds which are relatively easy to cleave. Accordingly, Bi alkoxides can be decomposed at lower temperatures. Decomposition and deposition at a lower temperature decreases the migration of Bi oxide to the bottom electrode and the substrate. The degradation of the preexisting structure is thereby minimized. Furthermore, Bi alkoxides do not require oxygen as a co-reactant for the formation of the Bi oxide layer. It is believed that this contributes to conformal deposition of Bi oxides.

Unless otherwise defined, all technical and scientific terms used herein have the same meaning as commonly understood by one of ordinary skill in the art to which this invention belongs. Although methods and materials similar or equivalent to these described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

DETAILED DESCRIPTION

Chemical vapor deposition can be used to provide a thin film of Bi, Sr, and Ta oxides on a surface of a substrate. The substrate can then be used to manufacture devices such as storage cells.

Figure 1:
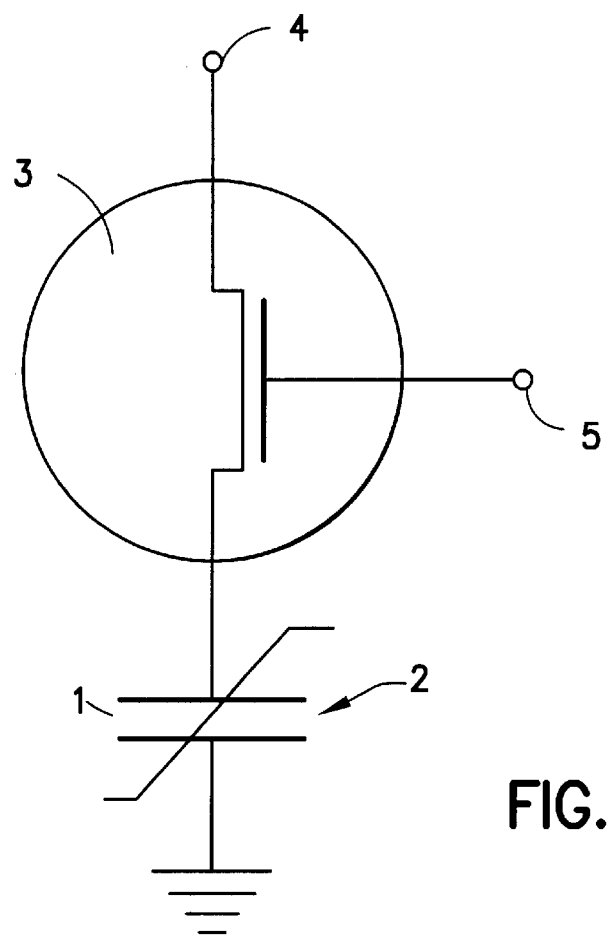
FIG. 1 is a schematic diagram of a storage cell with a ferroelectric memory.

Referring to FIG. 1, a storage cell is formed by placing a layer 1 of ferroelectric material between two plates of a capacitor 2. Capacitor 2 is connected to transistor 3 which has a bit-line 4 and a word-line 5, and which controls access of read-out electronics to capacitor 2. Ferroelectric layer 1 stores information by polarization in a non-volatile manner.

Figure 2:
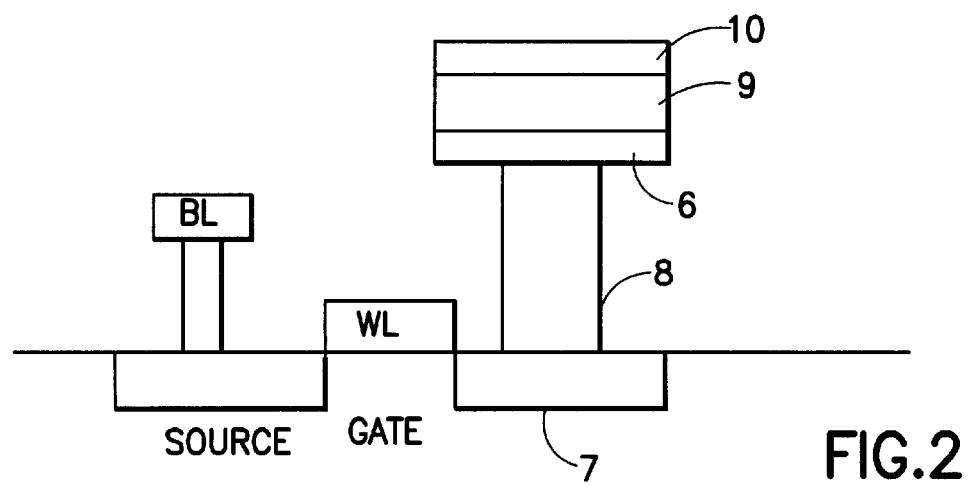
FIG. 2 is a schematic diagram of a SBT layer incorporated into a stack capacitor with a transistor.
Figure 3:
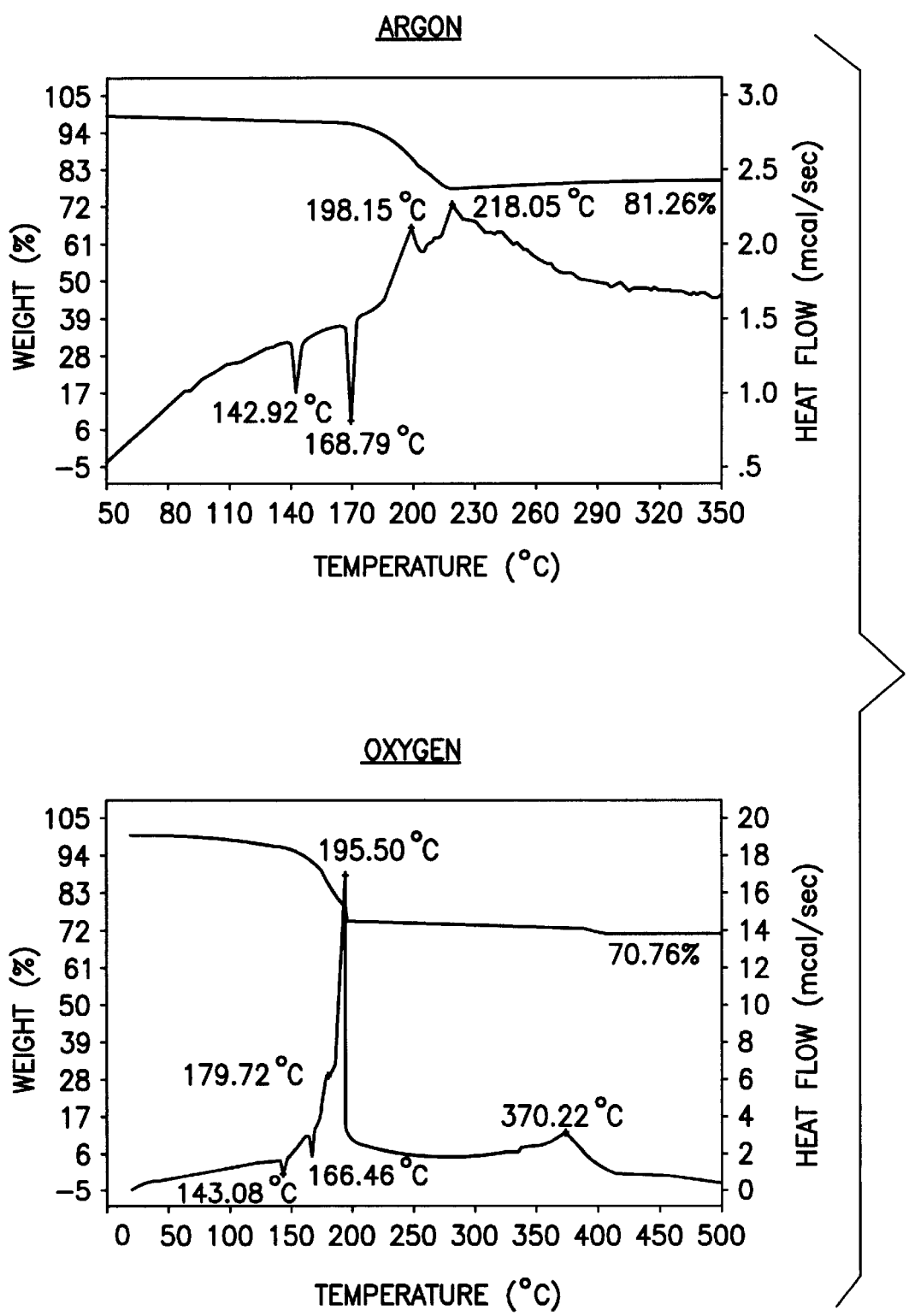
FIG. 3 is a graph showing the STA results of $Bi(OEt)_3$ in Ar (left) and $O_2$ (right).
Figure 4:
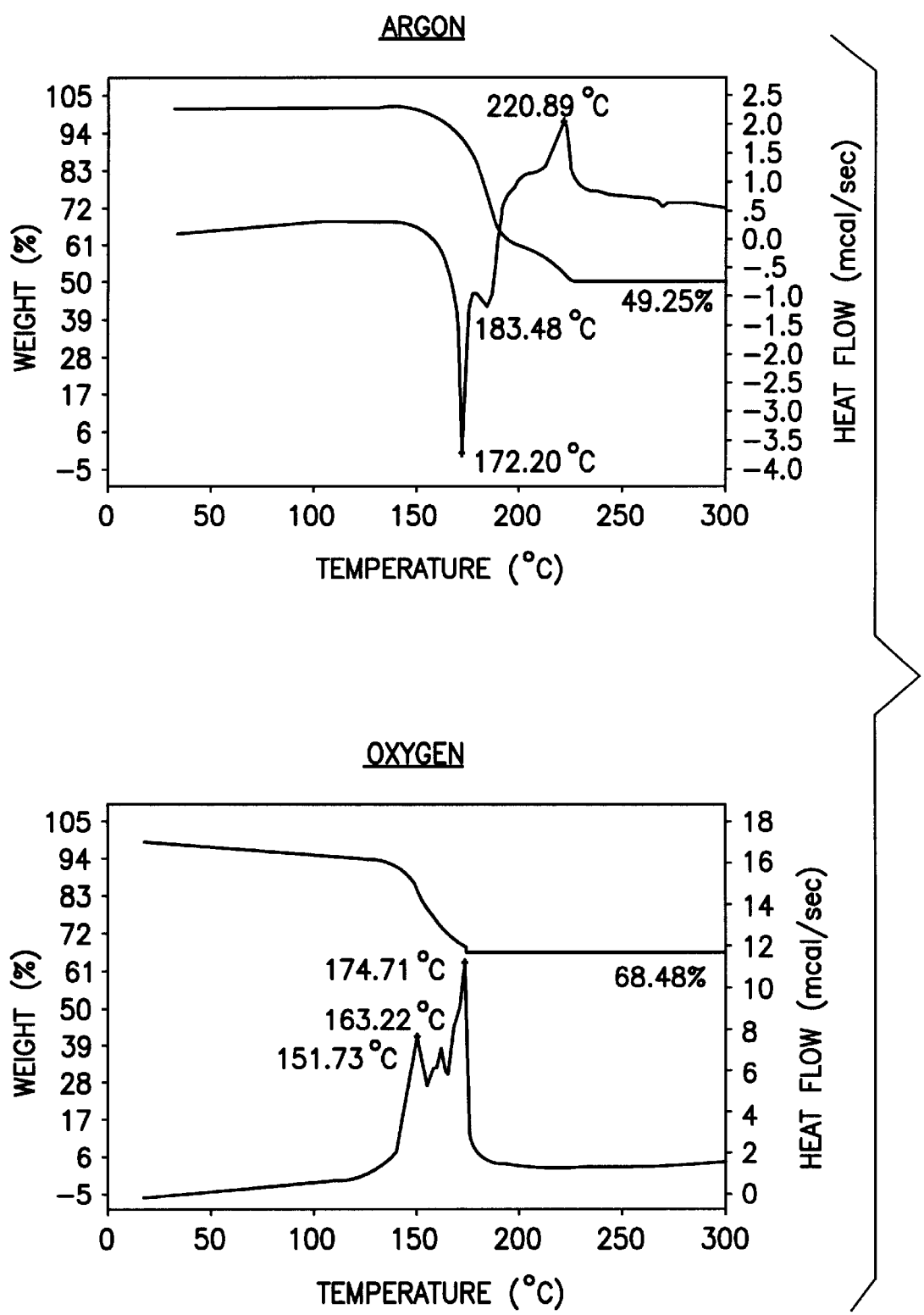
FIG. 4 is a graph showing the STA results of $Bi(O^iPr)_3$ in Ar (left) and $O_2$ (right).
Figure 5:
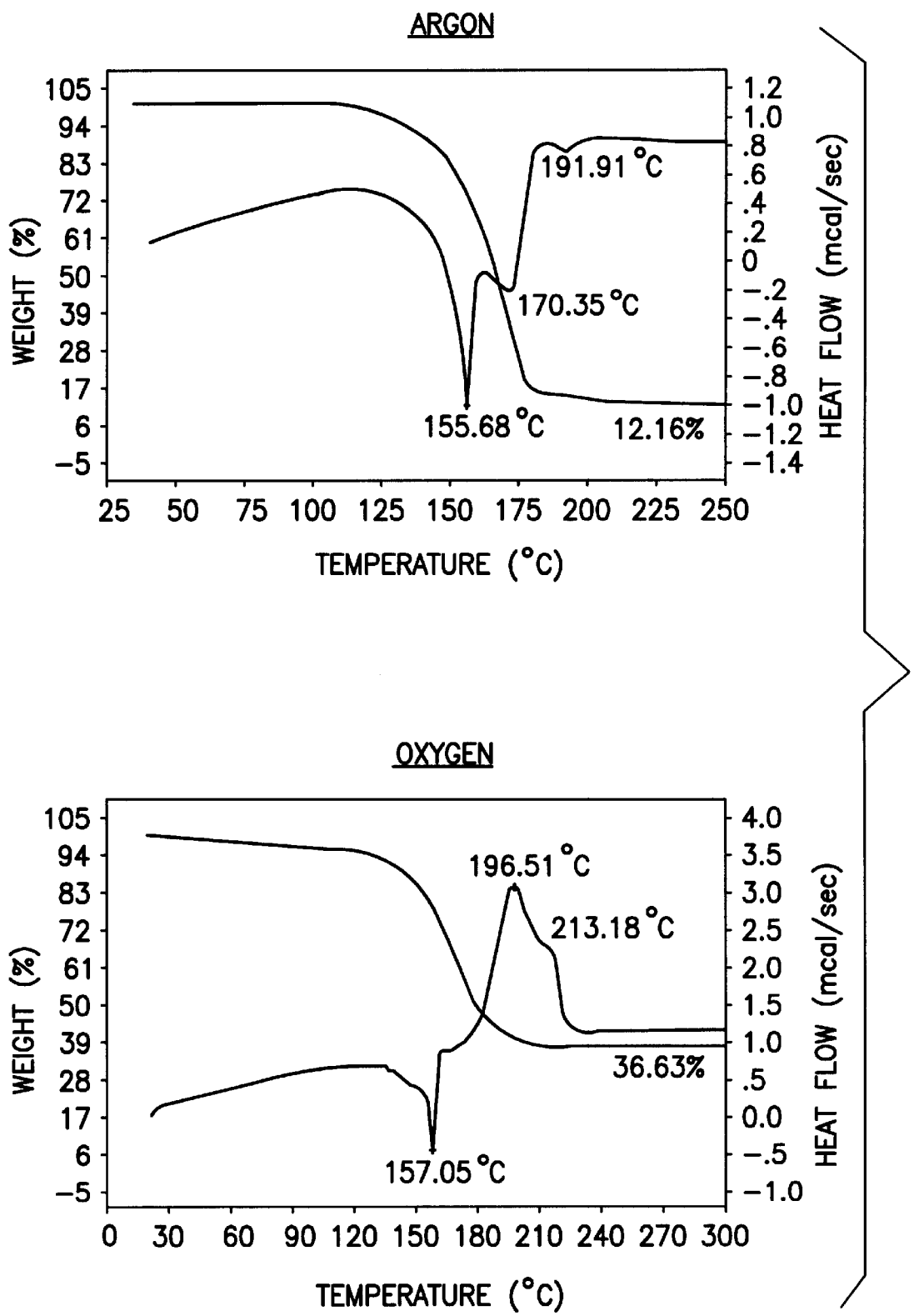
FIG. 5 is a graph showing the STA results of $Bi(O^tBu)_3$ in Ar (left) and $O_2$ (right).
Figure 6:
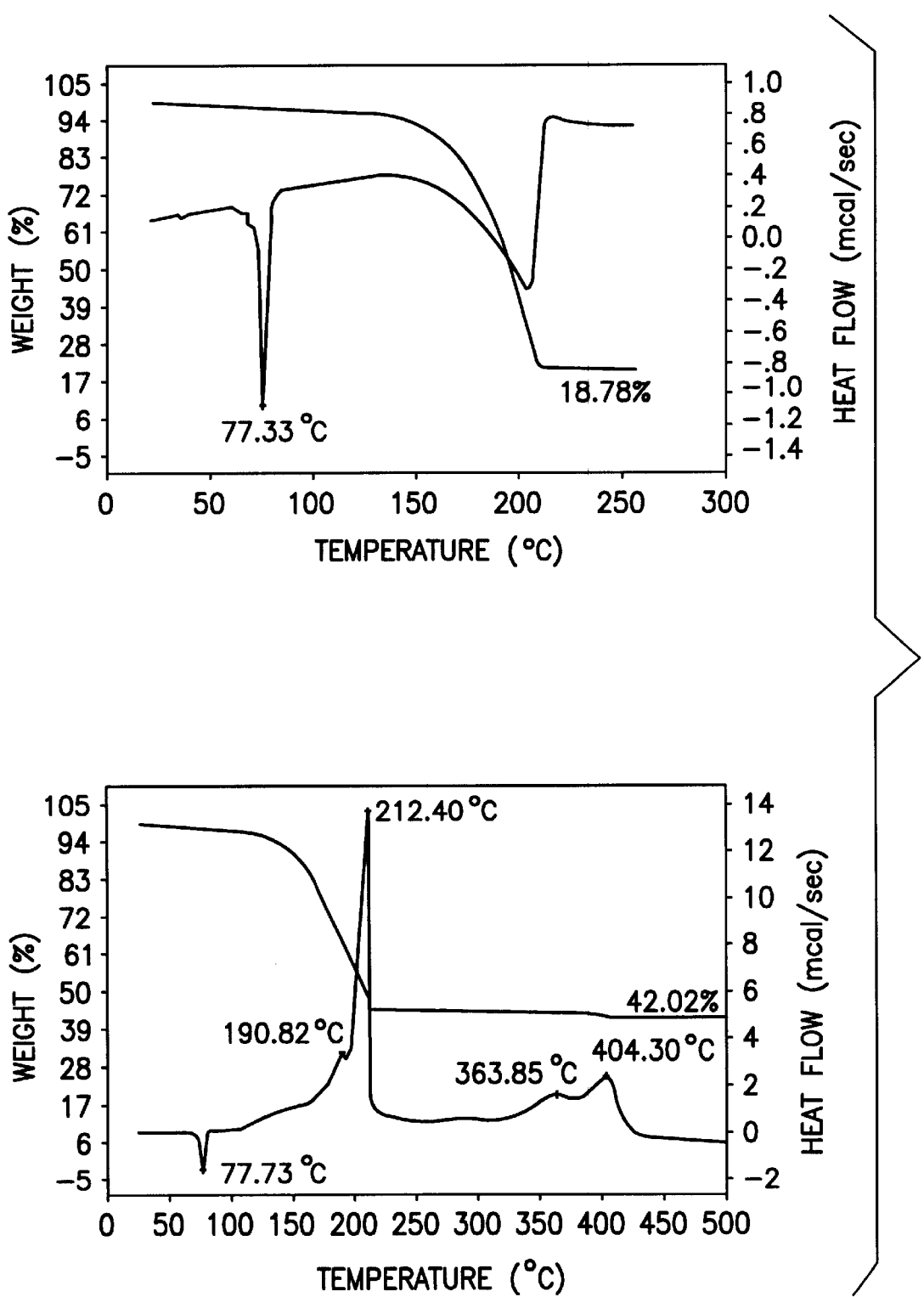
FIG. 6 is a graph showing the STA results of $Bi(O^tPe)_3$ in Ar (left) and $O_2$ (right).

Referring to FIG. 2, a ferroelectric SBT layer 9 is incorporated into a stack capacitor with a transistor to form a storage cell. The stack capacitor sits on top of the transistor, and the bottom electrode 6 of the capacitor is connected with a drain of the MOSFET (metal-oxide-semiconductor-field-effect-transistor) by a plug 8 which is made from either poly Si or W. Ferroelectric layer 9 is disposed between the bottom electrode 6 and the top electrode 10.

Chemical vapor deposition (CVD) is used to provide the ferroelectric layers in FIGS. 1 and 2. For example, CVD is used to deposit layers of metal oxides of Bi, Sr, and Ta on a $Pt/Ti/SiO_2/Si$ substrate. During CVD, a substrate is placed in a CVD chamber at a low pressure, and is heated to a deposition temperature. Precursors are vaporized and then delivered to the CVD chamber. Vapors of the precursors are decomposed at the surface of the substrate, and metal oxide molecules are deposited on the substrate to form a thin film. Metal oxide films formed by the CVD process have higher conformality and better step coverage than films produced by other methods. Further advantages of the CVD process include high film uniformity, high film density, the capability to grow very thin films, a high throughput, and low manufacturing costs.

The precursors react under the desired process conditions depositing a Bi-based oxide ceramic film on the substrate. In accordance with the invention, the Bi-based oxide ceramic film is deposited substantially in amorphous forms, without substantially any fluorite phase present. In one embodiment, the as-deposited film is amorphous as determined by x-ray diffraction (XRD). A (D/maxB XRD) system manufactured by Rigaku was used. The system was set up with a graphite curved crystal monochrometer and a Cu X-ray target.

Depositing an amorphous Bi-based oxide ceramic film without substantially any fluorite phase contradicts conventional wisdom, which suggests that the fluorite phase is crucial as an intermediate phase from which the deposited film is transformed into a ferroelectric. See for example Isobe et al., Integrated Ferroelectric, 1997,Vol. 14, pp. 95–103. There are several reasons why the fluorite phase is believed to important. It is believed that the fluorite phase serves to transport the as-deposited film up to the reaction temperatures required for the perovskite formation without phase separation, e.g., to prevent separation of the oxides during annealing. Additionally, the pre-arrangement of the atoms in a fluorite phase may facilitate a fast film transformation to the Aurivillius phase.

We have discovered that depositing an amorphous Bi-based oxide ceramic film without substantially any fluorite phase is advantageous. For example the amorphous film requires a lower thermal budget than conventional as-deposited films to transform it into the ferroelectric phase. Furthermore, ferroelectrics formed from amorphous films have better electrical characteristics than those formed from conventional techniques.

It is believed that the reason a lower thermal budget is needed to transform the amorphous precursor film into the ferroelectric phase is because amorphous films are more compositionally homogeneous than the fluorite-containing as-deposited films. Heterogeneous films such as the fluorite containing films require more time and higher temperature anneals because some atoms in these film have to move over longer distances. Other detrimental phases might be formed during the longer high temperature anneal in parts of the films with the wrong composition.

In contrast to the conventional as-deposited films, the substantially amorphous as-deposited film is relatively smooth with smaller or no features. The relatively smooth surface indicates that there is reduced Bi segregation during deposition, which produces a film that is more homogeneous in composition than conventional as-deposited films with fluorite phase. The surface morphology of XRD amorphous films is smooth with no or almost no features, indicating that the film is homogeneous in composition.

The amorphous nature of the Bi-based oxide ceramic film is affected by the deposition temperature. The Hi-based oxide ceramic is deposited at a temperature which produces a substantially amorphous film. In one embodiment, the deposition temperature is less than 430° C., preferably at about 280–430° C., more preferably at about 280–410° C., more preferably at about 330–400° C., more preferably at about 330–390° C., more preferably at about 350–390° C., more preferably at about 360–380° C., and more preferably at about 380° C. At temperatures less than 430° C., a substantially amorphous film is produce It has been found, in one that an XRD amorphous film is produced when deposited at temperatures of about 380° C. or less.

The deposition pressure of a reactor has also has been found to affect the amorphous nature of the deposited film. In one embodiment, the pressure at which the film is deposited produces a substantially amorphous film. The deposition pressure, for example, is about 0.1 to 760 torr, preferably greater than about 1 torr, more preferably about 1–20 torr, more preferably about 3–20 torr, more preferably about 5–20 torr, more preferably about 7–20 torr, more preferably about 7–12 torr, and more preferably about 8–10 torr. As the deposition pressure increases, formation of fluorite phase decreases.

The ferro-anneal transforms the amorphous film into a ferroelectric. A ferro-anneal at a temperature of about 600–830° C. for about 1–60 minutes, depending on the temperature, has been found to be sufficient to convert the amorphously deposited film to the ferroelectric Aurivillius phase. The higher the temperature of the anneal, the shorter the time required to transform the substantially amorphous film to the Aurivillius ferroelectric phase. For example, an anneal of about 5 minutes at 750° C. is sufficient to complete the transformation to the Aurivillius phase. A slightly longer anneal of about 10 minutes is sufficient to complete the transformation to the Aurivillius phase at about 700° C.

PRECURSORS FOR BI OXIDES

Bi alkoxides contain Bi—O bonds which are relatively easy to cleave. Bi alkoxides also include other bonds which can be cleaved at a relatively low temperature. Furthermore, when Bi alkoxides used as precursors of Bi oxide, oxygen is not required as a co-reactant for the formation of the Bi oxide layer. It is believed that these properties of Bi alkoxides contribute to the favorable decomposition mechanism of Bi alkoxides and conformal deposition of Bi oxides.

Bi oxides can be deposited at low temperatures, for example, at 300° C. Oxides of Bi, Sr, and Ta can be deposited together in a desired film stoichiometry, such as $Bi_2O_3$—$SrO$—$Ta_2O_5$. The SBT film obtained using Bi alkoxides as a precursor of Bi oxide exhibits high uniformity of composition within the wafer, high conformity to the structure of the surface, and high run-to-run repeatability. The film of Bi, Sr, and Ta oxides formed by the low temperature deposition is generally non-ferroelectric but can be transformed, by a post-deposition treatment such as annealing, into a ferroelectric Aurivillius phase.

Bi alkoxides used as precursors of Bi oxides generally have the structure $Bi(OR)_3$, $Bi(OR)_2(OR')$ or $Bi(OR)(OR')(OR'')$, where each of R, R', and R" is, independently, an alkyl, aryl, or silyl group. For example, R may be pentyl, pentyl, $^tBu$, Bu, $^iPr$, Pr, Et, Me, Ph, aryl, or $SiR'''_3$, where R''' is $^tBu$, Bu, $^iPr$, Pr, Et, or Me. Examples of Bi alkoxides include $Bi(OC_5H_{11})_3$, $Bi(OCMe_2Et)_3$, $Bi(O^tBu)_3$, and $Bi(O^iPr)_3$.

Bi alkoxides also include derivatives of the precursors discussed above. They also include derivatives in which the alkyl groups contain donor atoms, such as N, O, or S. For example, a —$CH_2CH_2$—$N(CH_3)_2$ group may be incorporated into a Bi alkoxide provide the precursor, $Bi(O-CH_2CH_2-N(CH_3)_2)_3$.

All of these molecules are capable of undergoing oxidative decomposition at very low temperatures. Accordingly, these molecules yield Bi oxides in a controlled and reproducible manner. Additional information regarding the preparation of these precursors may be found in one or more of the following references. A. P. Pisarevskii et al., Inorg. Chem. 35(6), p.84 (1990); W. A. Hermann et al., Chem. Ber. 126, p.1127 (1993); R. G. Goel et al., J. Organomet. Chem. 36, p.323 (1972); Y. Okuhara et al., 9th Int. Symp. on Int. Ferroelectrics, Development of New Ferroelectric Source Materials for MOCVD and MOD, p.133i (1997); Y. Kojima et al., Integrated Ferroelectrics, 18, p.183 (1997); JP 9067197; JP 9077592; JP 8339716;

BI-CONTAINING METAL OXIDES

Bi-containing metal oxides deposited on the substrate generally have the following structure:

$$(Bi_2O_2)^{2+}(A_{m-1}B_mO_{3m+1})^{2-},$$

where A is $Bi^{3+}$, $L^{3+}$, $L^{2+}$, $Ca^{2+}$, $Sr^{2+}$, $Ba^{2+}$, $Pb^{2+}$, or Na+, B is $Fe^{3+}$, $Al^{3+}$, $Sc^{3+}$, $Y^{3+}$, $L^{3+}$, $L^{4+}$, $Ti^{4+}$, $Nb^{5+}$, $Ta^{5+}$, $W^{6+}$, or $Mo^{6+}$, where L represents a metal from the lanthanide series, such as $Ce^{4+}$, $La^{3+}$, $Pr^{3+}$, $Ho^{3+}$, $Eu^{2+}$, or $Yb^{2+}$, and m is 1, 2, 3, 4, or 5. These Bi-containing metal oxides are predominantly non-ferroelectric, but can be transformed by an annealing process into ferroelectric oxides with a layered perovskite structure such as the one in the Aurivillius phase. Examples of Bi-containing metal oxides further include:

$Bi_2WO_6$;

$BiMO_3$, where M is Fe or Mn;

$Ba_2BiMO_6$, where M is V, Nb or Ta;

$Pb_2BiMO_6$, where M is V, Nb or Ta;

$Ba_3Bi_2MO_9$, where M is Mo or W;

$Pb_3Bi_2MO_9$, where M is Mo or W;

$Ba_6BiMO_{18}$, where M is Mo or W;

$Pb_6BiMO_{18}$, where M is Mo or W;

$KBiTi_2O_6$; and $K_2BiNb_5O_{15}$.

Additional information regarding the preparation of these metal oxides may be found in one or both of the following references. T. Kodas and M. J. Hampden-Smith, The Chemistry of Metal CVD, Wiley (1994), and W. S. Rees, CVD of Nonmetals, Wiley (1996).

PRECURSORS FOR SR OXIDES $Sr(thd)_2$ or $Sr(thd)_2(tetraglyme)$ is generally used as the precursor of Sr oxide, where thd represents 2,2,6,6-tetramethyl-heptane-2,5-dionate. Additional ligands of the adduct may be:

- polyethers, for example, $R—O—(CH_2CH_2O)_n—R'$, where $2 \leq n \leq 6$, and where each of R and R' is, independently, an alkyl group, an aryl group or hydrogen; or
- polyamines, for example, $R—NR''-(CH_2CH_2NR'')_n—R'$, where $2 \leq n \leq 6$, where each of R and R' is, independently, alkyl, aryl, or hydrogen, and where R" is H, Me, Et or Pr.

$Sr(thd)_2$ adducts may include adducts with tetraglyme $(MeO—(CH_2CH_2O)_4-Me)$, triglyme $(MeO—(CH_2CH_2O)_3-Me)$, N,N,N',N",N"-pentamethyl-diethylene-triamine $(Me_2N—(CH_2CH_2NMe)_2-Me)$, or N,N,N',N",N'",N'"-hexamethyl-triethylene-tetramine $(Me_2N—(CH_2CH_2NMe)_3-Me)$.

Other examples of the precursors of Sr oxide include alkoxides, mixed alkoxides with Ta/Nb alkoxides, and a Lewis base adduct of the alkoxide, where the Lewis base is tetraglyme $(MeO—(CH_2CH_2O)_4-Me)$, triglyme $(MeO—(CH_2CH_2O)_3-Me)$, N,N, N', N", N"-pentamethyl-diethylene-triamine $(Me_2N—(CH_2CH_2NMe)_2-Me)$, or N,N, N', N", N'", N'"-hexamethyl-triethylene-tetramine $(Me_2N—(CH_2CH_2NMe)_3-Me)$.

PRECURSORS FOR TA OXIDES

The precursor of Ta oxide generally has the structure $Ta(OR)_{5-n}(X)_n$, where R is Me, Et, Pr, $^i$Pr, Bu, $^i$Bu, $^t$Bu, pentyl, or $^t$pentyl, where X is β-diketonate, and where $1 \leq n \leq 5$. For example, $Ta(O^iPr)_4(thd)$ may be used as the precursor of Ta oxide.

A alkoxides may also be used as the precursor of Ta oxide. Examples include, but are not limited to, Ta pentakis (ethoxide), Ta pentakis ($^i$propoxide), Ta pentakis ($^t$butoxide), Ta pentakis ($^t$pentoxide), Ta alkoxides, and Ta complex including a mixture of these ligands.

SBT

Strontium bismuth tantalates generally have the structure $SrBi_2Ta_2O_9$, or one of its derivatives, such as:

$SrBi_2Ta_{2-x}Nb_xO_9$, where $0 \leq x \leq 2$;

$SrBi_2Nb_2O_9$;

$Sr_{1-x}Ba_xBi_2Ta_{2-y}Nb_yO_9$, where $0 \leq x \leq 1$ and $0 \leq y \leq 2$;

$Sr_{1-x}Ca_xBi_2Ta_{2-y}Nb_yO_9$ where $0 \leq x \leq 1$ and $0 \leq y \leq 2$;

$Sr_{1-x}Pb_xBi_2Ta_{2-y}Nb_yO_9$, where $0 \leq x \leq 1$ and $0 \leq y \leq 2$;

$Sr_{1-x-y-z}Ba_xCa_yPb_zBi_2Ta_{2-p}Nb_pO_9$, where $0 \leq x \leq 1$, $0 \leq y \leq 1$, $0 \leq z \leq 1$, and $0 \leq p \leq 2$.

SBTs also include the above described compounds in which one or more elements are substituted and/or doped by a metal from the lanthanide series, such as Ce, La, Pr, Ho, Eu, and Yb.

SOLUTION MIXTURES

Preferably, liquid delivery CVD is used in the methods of the invention. During liquid delivery CVD, precursors of Bi, Sr, and Ta oxides are dissolved in a solvent or a mixed solution and are then delivered to a vaporizer in a liquid phase. Examples of solvents include, but are not limited to, aliphatic, cycloaliphatic or aromatic solvents, which may have functional groups such as alcohols, ethers, esters, amines, ketones, and/or aldehydes. Mixture of these solvents may also be used, for example, a mixture of THF, $^i$PrOH, and a Lewis base in a ratio of 8:2:1, respectively, and a mixture of octane, decane, and pentamethyl-diethylene-triamine in a ratio of about 5:4:1.

When homoleptic bismuth alkoxides $(Bi(OR)_3)$, such as $Bi(O^tBu)_3$ and $Bi(OC(Me)_2Et)_3$, are used, Lewis base adducts are used to provide suitable solutions for the liquid delivery of the precursors of Sr, Bi, and Ta oxides. The excess alcohol facilitates transport of Bi alkoxides, and the excess Lewis base improves the stabilization and transport of the Group II species, namely $Sr(thd)_2$ tetraglyme or $Sr(thd)_2$ polyamine. The solution compatibility is critical in controlling the transport and delivery of the solution, and for prolonging the lifetime of the vaporizer.

Precursors of Ta oxide may be altered for compatibility with Bi alkoxide in a solution. For example, the substitution of $(O^tBu)$ ligands for $(O^iPr)$ in the usual $Ta(O^iPr)_4(thd)$ may improve long-term compatibility and storage of the solution. Furthermore, the identity of the components of the solution can be maintained for extended periods of time without ligand exchange and ultimate uncontrolled degradation of the precursors. Further details are described in a currently pending patent application U.S. Ser. No. 09/107,861, filed Jun. 30, 1998, entitled "Amorphously deposited metal oxide ceramic films," which is hereby incorporated by reference.

VAPORIZATION PROCESS

Precursors of Bi, Sr, and Ta oxides are vaporized prior to the delivery of these oxides to a CVD chamber. The precursor solution is vaporized, for example, in one or more flash vaporizers. The precursor solution may contain all three precursors, or multiple solutions may be used in which each solution contains one or more precursors.

In a CVD process with single-source liquid delivery, Bi alkoxide is vaporized in tandem with the precursors of Sr and Ta oxides. Accordingly, it is necessary to prepare a solution which contains all three precursors. Another approach is to evaporate Bi alkoxide in one vaporizer and precursors of Sr and Ta oxides in a second vaporizer. The first approach is preferred for manufacturing the SBT layer, because it is easier and because it allows for controlled deposition.

Several delivery approaches may also be taken in the multiple vaporizer approach. The precursors are stored in separate solutions, each of which is evaporated in a separate vaporizer. The vapors are then mixed and delivered to the substrate surface in the CVD chamber. Alternatively, precursors of Sr and Ta oxides are stored in separate solutions which are mixed prior to vaporization, for example, by a liquid delivery system. The mixed solution is delivered to a single vaporizer. The precursor of Bi oxide is delivered to a second vaporizer. After evaporating the precursors, the vapors are mixed and delivered to the CVD chamber.

In yet another process, precursors of Sr and Ta oxides are stored as a precursor mixture in one solution and delivered to a single vaporizer. The precursor of Bi oxide is delivered to a second vaporizer. After evaporation of the precursors, the vapors are mixed and delivered to the CVD chamber. Alternatively, the precursor of Bi oxide may be vaporized in one vaporizer and precursors of Sr and Ta oxides in a second vaporizer. However, instead of having precursors of Sr and Ta oxides in two separate reservoirs, two solution mixtures are prepared where each contains precursors of Sr and Ta oxides in different concentrations. This allows more accurate mixing of the precursors of Sr and Ta oxides. Additional information regarding the CVD process may be found in one or more of the following references. U.S. patent application U.S. Ser. No. 08/758,599, filed Nov. 27, 1996, entitled "Multiple Vaporizer Reagent Supply System for Chemical Vapor Deposition Utilizing Dissimilar Precursor Composition"; U.S. Pat. No. 5,536,323; U.S. Pat. No. 5,337,651; U.S. Pat. No. 5,431,957; U.S. Pat. No. 5,362,328; and U.S. Pat. No. 5,204,314.

OXIDIZER

Precursors of Bi, Sr, and Ta oxides are decomposed in the presence of an oxidizer by oxidative decomposition. $O_2$ is generally used as an oxidizer. However, deposition efficiency may be improved by using more reactive oxidizers during the film deposition. Examples of these alternate oxidizers include singlet $O_2$, $O_3$, $H_2O_2$, $N_2O$, $NO_x$ ($1 \leq x \leq 3$), and downstream oxygen plasma.

The concentration of the oxidizer may be maintained at a level between 5% and 95% of the total gas and vapor flow into the CVD chamber. At least one of $O_2$ and $N_2O$ may be used as the oxidizer. The oxidizer may be supplied to the CVD chamber from an external source such as a tank, or may be formed in the CVD chamber by converting a molecule therein into an active oxidizer by applying to the CVD chamber plasma, UV light, heat, a sensitizer, or ion beams.

$O_3$ can form oxygen radicals O which can react with the precursors of Bi oxide, Sr oxide, and/or Ta oxide. The reaction may occur in the boundary layer, for example, by inserting the O radical into the Bi—O bonds or by undergoing an electrocyclical bimolecular reaction. When $O_3$ reacts with a precursor containing a phenyl ring, $O_3$ may attack the ring and crack the molecule from another side, yielding an intermediate product such as O=BiPh$_3$, which may either decompose back to BiPh$_3$ or undergo a rearrangement to form a (PhO)BiPh$_2$. Chemical properties of the substrate surface may also be affected by $O_3$. For example, the amount of adsorbed O atoms may be increased, or the electrochemical potential of the surface and its electrical conductivity may be altered. $O_3$ may also affect the chemical properties of the surface of the Bi-containing metal oxide film during its growth in the CVD chamber.

NO and $NO_2$ can react with the precursors already in the boundary layer, for example. In addition, NO and $NO_2$ can be adsorbed on the substrate, react with intermediate products from the decomposition reaction of the precursors, or increase the substrate surface potential for further chemical reactions.

$H_2O_2$ can react with the precursors in the boundary layer or at the heterogeneous surface. $H_2O_2$ may form OH and OOH groups on the substrate and provide new decomposition pathways for the precursors.

Singlet $O_2(^1O_2)$ is a very effective oxidizer which can be formed by light irradiation of triplet $^3O_2$ in the presence of a sensitizer such as rose bengal or via direct irradiation of $^3O_2$ below 200 nm by, for example, a low pressure Hg lamp/excimer laser.

To form downstream oxygen plasma, the precursor vapor is mixed with an oxygen plasma. The reactive species in the plasma are single O atoms, activated $O_2$ molecules, and $O_3$. The plasma is generated before the oxidizer is mixed with the precursor vapor. This technique effectively modifies CVD processes without direct exposure of the precursors to the high translational energies present in the plasma. G. Lucovsky et al., J. Vac. Sci. Tech. A 4, 681, [1986]; Van Buskirk et al., J. Vac. Sci. Tech. A 10(4), 1578, [1992].

The use of oxidizers offers a number of benefits in depositing the Bi-containing metal oxide film. In general, oxidizers allow low temperature deposition of Bi oxides on the substrate. Oxidizers also stabilize and enhance the deposition of Bi oxides at low pressures. Oxidizers also help in depositing the Bi-containing metal oxide film in a desirable phase.

CVD PROCESS

The substrate is heated to a deposition temperature ranging from 300° C. to 500° C. Preferably, the substrate is heated to a temperature below 450° C. The pressure in the chamber is maintained between 0.1 and 10 torr. A carrier gas such as Ar, He, or $N_2$, and oxidizers such as O2, singlet $O_2$, $O_3$, $N_2O$, $NO_x$ ($1 \leq x \leq 3$), and downstream oxygen plasma are also delivered to the CVD chamber. The total gas flow is maintained between 1 and 15,000 sccm, where sccm represents a volumetric flow rate in the unit of cc/min measured at the standard condition, that is, at 0° C. and 1 atm. The deposition time ranges from 30 to 60 minutes.

CVD processes for SBT can be carried out at different deposition temperatures. For example, the CVD process at a temperature such as 430° C. yields a non-ferroelectric film in the fluorite phase. By annealing between 600° C. and 820° C., for example, at 750° C. for one hour, this film is converted into the ferroelectric Aurivillius phase. The structure of the deposited film depends on many different deposition parameters, although the deposition temperature has the most profound effect. For example, films deposited at lower temperatures, for example, at 350° C., are predominately amorphous.

At high temperatures, for example, 650° C., the CVD process yields films which are in a crystalline non-ferroelectric phase, such as a fluorite phase, or which are already in the ferroelectric Aurivillius phase. By annealing at 800° C. (ferroanneal), the non-ferroelectric SBT layer can be transformed into the ferroelectric Aurivillius phase, or the electrical properties of the existing ferroelectric films can be enhanced.

Alternatively, the deposition may be carried out under two different conditions. For example, it may be advantageous to deposit more Bi oxides in the beginning of the CVD process than during the rest of the process to compensate for a loss of Bi oxides due to depletion into the bottom electrode during deposition and/or annealing. It may also be helpful to have a nucleation control in the beginning, even if this decreases the growth rate. After the nucleation step, the conditions are changed for a high growth rate in the second deposition step. Nucleation is very important for phase control and can be very important for composition control, for example, if the film composition depends on the nature of the surface.

EXAMPLE 1

TGA AND DSC STUDY RESULTS

STA, a combination of thermogravimetric analysis (TGA) and differential scanning calorimetry (DSC) was performed in both argon and oxygen atmospheres. Using purified Bi alkoxides, a comparison of transport and stability was performed via controlled heating (10° C./min) in atmospheres of each gas.

The STA results of Bi(OEt)$_3$, Bi(O$^i$Pr)$_3$, Bi(O$^i$Bu)$_3$, and Bi(O$^t$Pe)$_3$ are shown in FIGS. 3, 4, 5, and 6, respectively. The left columns show the STA results of the Bi alkoxides in Ar, and the right columns show the STA results of the Bi alkoxides in $O_2$.

As illustrated by these Figures, the ethoxide and i-propoxide materials exhibited thermal decomposition during transport both in Ar, He, and $O_2$. It is believed that these processes produced oligomeric species that decomposed further upon continued heating. However, for $Bi(O^tBu)_3$ and $Bi(OC(Me)_2Et)_3$ in Ar, the data showed a sublimation point of 175° C. for the butoxide and of 210° C. for the pentoxide. Both compounds exhibited thermal transport in argon and were stable in $O_2$ at temperatures up to 190° C.

These Bi alkoxides had excellent evaporation characteristics and showed enough stability toward $O_2$ to avoid formation of particles in the gas-phase. It was therefore believed that Bi alkoxides, along with alkoxides of Sr and Ta, or mixed Sr/Ta alkoxides, could be used for the single source solution and liquid delivery transport of the precursors for SBT.

EXAMPLE 2

COMPATIBILITY STUDIES

Under some conditions, Bi alkoxides can show a rapid ligand exchange with $Sr(thd)_2$ in a solution mixture of THF, $^i$PrOH, and tetraglyme in a ratio of 8:2:1, respectively. For example, the alkoxides may be exchanged with the β-diketone ligands, resulting in a mixture of alkoxide β-diketonate precursors. Ligand exchange may also occur with the precursor of Ta oxide, where the rate of equilibration or ligand exchange is a function of the solvent composition and temperature. Equilibration may result in a changing precursor identity and, therefore, may affect the thermal stability and gas-phase transport during "flash" vaporization.

If ligand exchange of the precursors is observed, precursors having the same ligand can be used. In order to avoid ligand exchange when alcohol is used as the solvent, a solvent containing the same alkoxy group as the alkoxide ligands for the alkoxides should be used. Alternatively, precursors can be stored in separate solutions which are evaporated in separate vaporizers.

EXAMPLE 3

LOW-TEMPERATURE CVD PROCESS

A Pt/Ti/SiO$_2$/Si substrate (100 nm Pt on 10 nm Ti) is placed in a CVD chamber. The temperature of the substrate is maintained by a resistivity heater and kept between 300° C. and 500° C., for example, 430° C. The chamber pressure is between 0.5 and 5 torr, for example, 1 torr. The total gas flow is between 500 and 2,000 sccm, for example, 1,300 sccm. $O_2$ is used as an oxidizer. The amount of $O_2$ is between 20% and 80% of the total gas flow, for example 40%. The deposition time is 30 to 60 min.

$Bi(O^tBu)_3$ (Bismuth tris ($^t$butoxide)), $Sr(thd)_2$ (tetraglyme), and $Ta(O^tBu)_4(thd)$ are used as precursors of Bi oxide, Sr oxide, and Ta oxide, respectively. Precursors of Sr oxide and Ta oxide are stored in a solution of THF, $^i$PrOH, and tetraglyme in a ratio of 8:2:1, respectively. The concentrations in the solution are 0.3 molar Ta precursor and 0.15 molar Sr precursor. This solution is delivered by a pump to a flash-vaporizer and evaporated on a stainless-steel frit at a temperature between 210° C. and 230° C. A precursor solution delivery rate is 0.05–0.30 ml/min, for example, 0.15 ml/min. A carrier gas such as Ar is also delivered at a rate of 200–800 sccm, for example, 400 sccm. For a frit 1.6 cm in diameter, these flow rates give efficient evaporation results.

In a second approach, $Bi(O^tBu)_3$ is stored separately in a solution mixture of a decane, dodecane, and polyamine. The Sr source is changed to a polyamine adduct such as $Sr(thd)_2$ polyamine for compatibility. The concentration of Bi alkoxide is, for example, 0.1 molar. This solution is delivered to a second vaporizer which is maintained at a temperature of 200° C. For a stainless steel frit 1.6 cm in diameter, a liquid delivery rate of 0.05–0.30 ml/min, for example, 0.15 ml/min is used, and a carrier gas flow of 200–800 sccm, for example, 400 sccm is used. After vaporization, vapors of the precursors of Sr oxide and Ta oxide are mixed with Bi alkoxide vapors. These vapors are delivered to a CVD chamber through a showerhead in which they are mixed with $O_2$ and with additional Ar in order to adjust total gas flow and $O_2$ content. Gas flow rates are 400 sccm of Ar carrier for both precursors of Sr oxide and Ta oxide, 300 sccm of Ar carrier for Bi alkoxide, 180 sccm of additional Ar, and 520 sccm of $O_2$.

After the CVD process, the film is annealed at 750° C. for 60 minutes or at 800° C. for 15 minutes to form the ferroelectric Aurivillius phase.

EXAMPLE 4

HIGH-TEMPERATURE CVD PROCESS

Chemical vapor deposition is also carried out at higher temperatures, for example, at 600° C. Precursors and deposition conditions are the same as those used in the low temperature process. The high-temperature process results in a film which is in a non-ferroelectric fluorite phase, in a ferroelectric Aurivillius phase, or in a mixture of these phases.

After the CVD process, the deposited film is annealed at 750° C. for 60 minutes or at 800° C. for 15 minutes in order to form and/or to completely crystallize the ferroelectric Aurivillius phase.

EXAMPLE 5

MULTI-STEP CVD PROCESS

A multi-step process is also used, where a different deposition condition is applied for the first 2–10 minutes in order to yield a higher Bi content in the parts of the film adjacent to the Pt bottom electrode than in the rest of the film. An increased amount of the precursor of Bi oxide is delivered to the CVD chamber for the first 2–10 minutes, for example, by increasing the liquid delivery rate of the second, Bi alkoxide vaporizer. All other parameters in this step, and all parameters for the second step, are the same as those used in the single-step process.

EXAMPLE 6

Bi-based oxide ceramic films comprising Sr and Ta were deposited on a silicon substrate. The substrate was processed to include a 635 nm thick silicon oxide. Above the silicon oxide is a 10 mm thick Ti adhesion layer and a 100 nm thick Pt layer. $Sr(thd)_2(pmdeta)$, $Bi(thd)_3$ and $Ta(thd)(O:Pr)_4$ precursors were used. The precursors were stored in solutions of a single metal/organic specie in a solvent comprising octane/decane/pmdeta in a 5:4:1 ration by volume. The concentration of $Sr(thd)_2(pmdeta)$ was 0.15M, $Bi(thd)_3$ was 0.3M, and $Ta(thd)(O:Pr)_4$ was ).3m. Ar and $O_2$ were mixed with precursor vapors in a 4:6 ratio per volume. The as-deposited film comprises a Bi/2Ta ratio of about 1.8–2.2 and Sr/2Ta ratio of about 0.8–1.0.

The films were deposited under 5 different conditions of temperature, liquid delivery rate, and total gas flow, as listed in Table 1. Pressure was varied for the different conditions.

The as-deposited films were analyzed to determine the film's thickness, composition, surface morphology, phase content, and Bi loss into the substrate during deposition. X-ray fluorescence (XRF) analysis was used to determine the thickness and composition of the films. Surface morphology was analyzed using SEM, AFM, and TEM. XRD and TEM were used to analyze the phase content of the as-deposited film. The surface morphology and XRD intensity of the flourite phase of the as-deposited films are listed in Table 2.

TABLE 1

| Dep. Cond. | T [° C.] | Liquid delivery rate | Total gas flow [slm] |
|---|---|---|---|
| #1 | 430 | 0.1 | 10 |
| #2 | 430 | 0.2 | 1.6 |
| #3 | 430 | 0.1 | 1.6 |
| #4 | 380 | 0.2 | 10 |
| #5 | 380 | 0.2 | 1.6 |

TABLE 2

| Film # | Press. [Torr] | Dep. Cond. | Dep. Rate [nm/Min] | Morphology (SEM) | Fluorite |
|---|---|---|---|---|---|
| 1 | 3 | #1 | 3.1 | Islands | 90000 |
| 2 | 3 | #2 | 7.7 | Bumps | 6500 |
| 3 | 3 | #3 | 3.4 | Bumps | 1100 |
| 4 | 3 | #4 | 4.2 | Smaller Bumps | 400–700 |
| 5 | 3 | #5 | 5.8 | Smaller Bumps | 800–2200 |
| 6 | 5 | #1 | 3.1 | Bumps in High | 60000 |
| 7 | 5 | #2 | 6.2 | Bumps | 20000 |
| 8 | 5 | #3 | 3.5 | Some Bumps | 800 |
| 9 | 5 | #4 | 5.1 | Fewer Smaller Bumps | 0–1300 |
| 10 | 5 | #5 | 6.5 | Fewer Smaller Bumps | 0 |
| 11 | 7 | #5 | 6.0 | Smooth | 0 |
| 12 | 9 | #1 | 2.8 | Bumps in High | 40000 |
| 13 | 9 | #2 | 3.1 | Bumps | 5500 |
| 14 | 9 | #3 | 2.7 | Small Bumps | 1400 |
| 15 | 9 | #4 | 4.7 | Smooth | 0 |
| 16 | 9 | #5 | 4.2 | Smooth | 0 |

XDR spectra of the as-deposited films formed by conditions 1–3 show peaks that can be correlated to a fluorite structure. Also, Bi rich features like bumps or islands were present, indicating Bi segregation. From Table 2, the intensity and size of the features decrease with decreasing deposition temperatures. A decrease in intensity and size of the features correlates with a decrease in Bi segregation. The intensity and size of the features decrease also with increasing deposition pressure as indicated by, for example, a comparison of films 1 and 6. The intensity and size of the features also decrease with increasing growth rates as indicated by, for example, a comparison of films 1 and 2.

The analysis of film 9 shows an almost smooth film with little fluorite phase formation. Increasing the deposition pressure to 9 torr results in a smooth XRD amorphous film with no fluorite phase as indicated by film 15. Also, depositing a film under the condition of film 10, 11, or 16 produces a smooth XRD amorphous film with no fluorite phase.

The transformation of substantially amorphous or XRD amorphous films into the ferroelectric phase was compared with conventional ferroelectrics formed from fluorite containing films. Experiments have shown that amorphous films were transformed completely into the ferroelectric Aurivillius phase after 5 minutes at 750° C. and after 10 minutes at 700° C. In contrast, a fluorite-containing film takes more than, for example, 10 minutes at 750° C. to convert into the ferroelectric phase. Thus, at a given temperature, the ferroanneal used to transform the amorphous films into the ferroelectric phase is much quicker than that for fluorite films, consuming a lower thermal budget.

Experiments have also shown that at comparable annealing temperatures and duration, higher remanent polarization ($2P_r$) values were achieved in a shorter amount of time with SBT ferroelectrics formed from amorphous films than with those formed from fluorite films. For example, annealing the amorphous film at 800° C. for about 2.5 minutes and 5 minutes produced $2P_r$ values of 8.5 and 12.5 $\mu C/cm^2$, respectively. Annealing the amorphous film at 730° C. for about 10 minutes produced a $2P_r$ value of about 6.9 $\mu C/cm^2$. On the other hand, annealing a fluorite film at 730° C. for about 10 minutes produced a $2P_r$ value of only about 1 $\mu C/cm^2$. A $2P_r$ value of about 8 $\mu C/cm^2$ was yielded after more that 60 minutes at 730° C. for the fluorite film.

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A chemical vapor deposition method of forming a ferroelectric Aurivillius phase film comprising Bi oxide an a substrate, said method comprising:
   dissolving a precursor of Bi oxide in a solution, wherein said precursor of Bi oxide comprises at least one alkoxide group;
   vaporizing said precursor of Bi oxide to form Bi oxide precursor vapor;
   depositing said Bi oxide on said substrate by chemical vapor deposition from said Bi oxide precursor vapor, at a substrate temperature that is between 280–430° C., and a deposition pressure, oxidizer, and growth rate sufficient to effect formation of a substantially amorphous film; and
   annealing said amorphous film for a period of time that is less than one hour at a temperature that is from about 600–830° C. to convert said amorphous film to said ferroelectric Aurivillius phase film.

2. The method of claim 1, wherein said step of decomposing said precursor and depositing said Bi oxide takes place at temperature lower than 380° C.

3. The method of claim 1, further comprising:
   decomposing precursor of Sr oxide and a precursor of Ta oxide and depositing said Sr oxide and said Ta oxide on said substrate at a temperature lower than 400°.

4. The method of claim 3, wherein said precursors of Sr oxide and Ta oxide are dissolved in a solution prior to being decomposed.

5. The method of claim 4, wherein said method further comprises:
   placing said substrate in a chamber,
   heating said substrate to a deposition temperature lower than 400° C.;
   introducing vapors of said precursor of Bi oxide, said precursor of Sr oxide, and said precursor of Ta oxide into said chamber;

decomposing aid precursors of Bi oxide, Sr oxide, and Ta oxide into said oxides thereof; and depositing said oxides on said substrate.

6. The method of claim 5, wherein the decomposition of said precursors comprises:

introducing an oxidizer into said chamber; and converting said precursors into said oxides by oxidative decomposition.

7. The method of claim 6, wherein said oxidizer comprises at least one of $O_2$, singlet $O_2$, $O_3$, $H_2O_2$, $N_2O$, $NO_x$, where x is 1, 2 or 3, and downstream oxygen plasma.

8. The method of claim 7, wherein said oxidizer occupies between 5% and 95% of the total gas and vapor flow into said chamber.

9. The method of claim 7, wherein said oxidizer comprises at least one of $O_2$ and $N_2O$.

10. The method of claim 6, wherein at least two different oxidizers are introduced into said chamber.

11. The method of claim 6, wherein said oxidizer is formed by converting a molecule in said chamber into an active oxidizer by applying at least one of a plasma, UV light, heat, a sensitizer, and ion beams.

12. The method of claim 6, wherein an additional inert gas is added to said chamber, said inert gas comprising at least one of Ar, He, and $N_2$, and wherein said additional inert gas occupies between 10% and 90% of the total gas and vapor flow into said chamber.

13. The method of claim 6, wherein said substrate is flushed with a mixture of an inert gas and said oxidizer before being exposed to said vapors of said precursors of said metal oxides.

14. The method of claim 6, wherein said substrate is flushed with a mixture of an inert gas and said oxidizer after being exposed to said vapor of said precursors.

15. The method of claim 6, wherein said substrate is removed from said chamber, treated by at least one intermediate process, and returned to said chamber.

16. The method of claim 6, wherein the composition of said oxidizer is varied while said substrate is positioned in said chamber.

17. The method of claim 6, wherein said vapors of said precursors, said oxidizers, and an inert gas comprising at least one of Ar, He, and $N_2$ are introduced to said chamber at a total flow rate of 1 ml/min to 15,000 ml/min, measured at the standard condition.

18. The method of claim 5, wherein said oxides are deposited at a temperature between 300° C. and 350° C.

19. The method of claim 5, wherein the pressure in said chamber is between 0.001 torr and 760 torr.

20. The method of claim 19, wherein the pressure in said chamber is between 0.1 torr and 10 torr.

21. The method of claim 5, wherein at least one of said processes of heating, decomposing and depositing is performed at least twice on said substrate.

22. The method of claim 5, wherein said deposition temperature is varied while said substrate is positioned in said chamber.

23. The method of claim 5, wherein the pressure in said chamber is varied while said substrate is positioned in said chamber.

24. The method of claim 5, wherein said substrate is heated inside said chamber at a temperature lower than 400° C. at least twice.

25. The method of claim 5, wherein said substrate is heated inside said chamber at a temperature lower than 400° C. in the presence of at least one of $O_2$ and $O_3$.

26. The method of claim 4, wherein at least one of said precursors is dissolved in a solution comprising at least one of an aliphatic, cycloaliphatic, and an aromatic solvent, said solvent including a functional group comprising at least one of an alcohol, ether, ester, amine, ketone, and aldehyde group.

27. The method of claim 26, wherein said precursors of Bi oxide, Sr oxide, and Ta oxide are dissolved in said solution.

28. The method of claim 27, wherein said solvent is an alcohol.

29. The method of claim 28, wherein said alcohol is t-butanol and said precursor of Bi oxide is $Bi(O^tBu)_3$.

30. The method of claim 28, wherein said solvent is t-pentanol and said precursor of Bi oxide is $Bi(OCMe^2Et)_3$.

31. The method of claim 26, wherein said solution comprises a mix of THF, $^iPrOH$, and a Lewis base in a ratio of about 8:2:1, respectively.

32. The method of claim 26, wherein said solution comprises a mixture of octane, decane, and pentamethyl-diethylene-triamine in a ratio of about 5:4:1, respectively.

33. The method of claim 26, wherein said precursor of Bi oxide is dissolved in a solution comprising Lewis base adducts.

34. The method of claim 26, wherein said solution is evaporated by at least one vaporizer.

35. The method of claim 34, wherein said solution is evaporated at a temperature from 130° C. to 220° C.

36. The method of claim 34, wherein said solution is evaporated at a temperature from 170° C. to 240° C.

37. The method of claim 34, wherein an inert gas is added to the vapors of said solution and a mixture of said inert gas and vapors is delivered to said chamber, said inert gas comprising at least one of Ar, He, and $N_2$.

38. The method of claim 37, wherein said mixture comprises vapors of said precursors of Bi oxide, Sr oxide, and Ta oxide in a ratio of about 2:1:2.

39. The method of claim 37, wherein the composition of said inert gas in said mixture is varied while said substrate is positioned in said chamber.

40. The method of claim 34, wherein said vapors consisting essentially of said precursor of Bi oxide are delivered to said chamber during a period between the onset of deposition and 30 minutes thereafter.

41. The method of claim 34, wherein the composition of said precursors in said mixture is varied while said substrate is positioned in said chamber.

42. The method of claim 3, wherein said precursor of Sr oxide is $Sr(thd)_2$ or $Sr(thd)_2$ adduct.

43. The method of claim 42, wherein said precursor of Sr oxide compromises at least one of a polyether and a polyamine.

44. The method of claim 43, wherein said polyether has the formula $R—O—(CH_2CH_2O)_n—R'$, wherein and $2 \leq n \leq 6$, and wherein each of R and R' is, independently, an alkyl group, an aryl group, or hydrogen.

45. The method of claim 43, wherein said polyamine has the formula $R—NR''—(CH_2CH_2NR'')_n—R'$, wherein $2 \leq n \leq 6$, wherein each of R and R' is, independently, an alkyl group, an aryl group, or hydrogen, and wherein R" is H, Me, Et or Pr.

46. The method of claim 45, wherein said precursor of Sr oxide comprises at least one of tetraglyme, triglyme, N,N,N',N",N"-pentamethyl-diethylene-triamine, and N,N,N',N",N"',N"'-hexamethyl-triethylene-tetramine.

47. The method of claim 45, wherein said precursor of Sr oxide is Sr alkoxide, Sr alkoxide mixed with Ta and Nb alkoxides, or a Lewis base adduct of Sr alkoxide, wherein the Lewis base is tetraglyme, triglyme, N,N,N',N",N"-pentamethyl-diethylene-triamine, or N,N,N',N",N"',N"'-hexamethyl-triethylene-tetramine.

48. The method of claim 3, wherein said precursor of Ta oxide has the formula Ta(OR)$_{5-n}$(X)$_n$, wherein R is Me, Et, $^i$Pr, Bu, $^i$Pr, Bu, $^t$Bu, $^t$Bu, pentyl, or $^t$pentyl, wherein X is β-diketonate, and wherein n is 1, 2, 3, 4, or 5.

49. The method of claim 48, wherein said precursor of Ta oxide is Ta(O$^i$Pr)$_4$(thd).

50. The method of claim 48, wherein said precursor of Ta oxide is an alkoxide comprising at least one of Ta pentakis (ethoxide), Ta pentakis ($^i$propoxide), Ta pentakis ($^t$butoxide), and Ta pentakis ($^t$pentoxide).

51. The method of claim 3, wherein said oxides are deposited onto said substrate over a time period between 2 minutes and 2 hours.

52. The method of claim 3, wherein said oxides are deposited onto said substrate over a time period between 2 minutes and 15 minutes.

53. The method of claim 1, wherein said Bi oxide is deposited at a pressure ranging from about 5 to about 20 torr.

54. The method of claim 53, wherein said film is heated to a temperature between 600° C. and 800° C. for a time period between 5 minutes and 3 hours.

55. The method of claim 1, wherein said amorphous film is annealed at a temperature from about 700° C. to about 800° C. for about 5 to about 15 minutes.

56. The method of claim 1, wherein said precursor of Bi oxide has the formula Bi(OR)$_3$, Bi(OR)$_2$(OR'), or Bi(OR)(OR')(OR"), wherein each of R, R', and R" is, independently, an alkyl, aryl, or silyl group.

57. The method of claim 56, wherein said precursor of Bi oxide is Bi(OR)$_3$, wherein R is $^t$pentyl, pentyl, $^t$Bu, Bu, $^i$P, Pr, Et, Me, Ph, aryl, or SiR'"$_3$, wherein R'" is $^t$Bu, Bu, $^i$Pr, Pr, Et, or Me.

58. The method of claim 57, wherein said precursor of Bi oxide is Bi(O$^t$Bu)$_3$ or Bi(OCMe$_2$Et)$_3$.

59. The method of claim 1, wherein said precursor of Bi oxide comprises a phenoxy group, a silyl group, or a donor atom selected from the group consisting of N, O, and S.

60. The method of claim 1, wherein said film comprises at least one of Ca, Ba, Pb, Na, Fe, Al, Sc, Y, Ti, Nb, W, Mo, Ce, La, Pr, Ho, Eu, and Yb.

61. The method of claim 60, wherein said film comprises a compound having the formula $$(Bi_2O_2)^{2+}(A_{m-1}B_mO_{3m+1})^{2-},$$

wherein A is Bi$^{3+}$, L$^{3+}$, Ca$^{2+}$, Sr$^{2+}$, Ba$^{2+}$, Pb$^{2-}$, or Na$^+$, B is Fe$^{3+}$, Al$^{3+}$, Sc$^{3+}$, Y$^{3+}$, L$^{3+}$, L$^{4+}$, Ti$^{4+}$, Nb$^{5+}$, Ta$^{5+}$, W$^{6+}$, or Mo$^{6+}$, wherein L is selected from the group consisting of Ce$^{4+}$, La$^{3+}$, Pr$^{3+}$, Ho$^{3+}$, Eu$^{2+}$ and Yb$^{2+}$, and m is 1, 2, 3, 4, or 5.

62. The method of claim 61, wherein said film comprises a compound selected from the group consisting of:

Bi$_2$WO$_6$;

BiMO$_3$, where M is Fe or Mn;

Ba$_2$BiMO$_6$, where M is V, Nb or Ta;

Pb$_2$BiMO$_6$ where M is V, Nb or Ta;

Ba$_3$Bi$_2$MO$_9$, where M is Mo or W;

Pb$_3$Bi$_2$MO$_9$, where M is Mo or W:

Ba$_6$BiMO$_{18}$, where M is Mo or W;

Pb$_6$BiMO$_{18}$, where M is Mo or W;

KBiTi$_2$O$_6$; and

K$_2$BiNb$_5$O$_{15}$.

63. The method of claim 1, wherein said film comprises a compound having a formula selected from the group consisting of:

SrBi$_2$Ta$_2$O$_9$;

SrBi$_2$Ta$_{2-x}$Nb$_x$O$_9$, wherein 0≦x≦2;

SrBi$_2$Nb$_2$O$_9$;

Sr$_{t-x}$Ba$_x$Bi$_2$Ta$_{2-y}$Nb$_y$O$_9$, wherein 0≦x≦1 and 0≦y≦2;

Sr$_{1-x}$Ca$_x$Bi$_2$Ta$_{2-y}$Nb$_y$O$_9$, wherein 0≦x≦1 and 0≦y≦2;

Sr$_{1-x}$Pb$_x$Bi$_2$Ta$_{2-y}$Nb$_y$O$_9$, wherein 0≦x≦1 and 0≦y≦2; and

Sr$_{1-x-y-z}$Ba$_x$Ca$_y$Pb$_z$Bi$_2$Ta$_{2-p}$Nb$_p$O$_9$, wherein 0≦x≦1, 0≦y≦1, 0≦z≦1, and 0≦p≦2.

64. The method of claim 63, wherein at least one element of said compound is substituted by a metal selected from the group consisting of Ce, La, Pr, Ho, Eu, and Yb.

65. The method of claim 1, wherein said substrate comprises at least one of Si, n-doped Si, p-doped Si, SiO$_2$, Si$_3$N$_4$, GaAs, MgO, Al$_2$O$_3$, ZrO$_2$, SrTiO$_3$, BaTiO$_3$, and PbTiO$_3$.

66. The method of claim 1, wherein said film is deposited on a bottom electrode disposed on said substrate, said substrate comprising a transistor therein, said bottom electrode being connected to said transistor by a plug.

67. The method of claim 66, wherein said bottom electrode comprising at least one of:

a metal selected from the group consisting of Pt, Pd, Au, Ir, and Rh;

a conducting metal oxide selected from the group consisting of IrO$_x$, RhO$_x$, RuO$_x$, OsO$_x$, ReO$_x$, WO$_x$, wherein x is 0, 1 or 2;

a conducting metal nitride selected from the group consisting of TiN$_x$, ZrN$_x$, and WN$_y$TaN$_y$, wherein 0≦x≦1.0 and 0≦y≦1.7; and a superconducting oxide selected from the group consisting of YbBa$_2$Cu$_3$O$_{7-x}$ wherein 0≦x≦1, and Bi$_2$Sr$_2$Ca$_2$Cu$_3$O$_{10}$.

68. The method of claim 66, wherein said bottom electrode is a Pt electrode.

69. The method of claim 66, wherein at least one first intermediate layer is provided between said bottom electrode and said plug, said first intermediate layer comprising at least one of an adhesion layer and a diffusion barrier layer.

70. The method of claim 66, wherein at least one second intermediate layer is provided between said bottom electrode and said metal oxide film, said second intermediate layer comprising at least one of a seed layer, a conducting layer, and a dielectric layer.

71. The method of claim 66, wherein said plug is connected to said bottom electrode and to a drain of a MOS ferroelectric effect transistor, said plug consisting essentially of W or Si.

72. The method of claim 66, wherein said film is used as a thin ferroelectric film for a ferroelectric capacitor.

73. The method of claim 66, wherein said film is used as a thin ferroelectric film for a ferroelectric memory.

74. The method of claim 73, wherein said film is used as a thin ferroelectric film for a ferroelectric field effect transistor.

75. A chemical vapor deposition method of forming a ferroelectric Aurivillius phase film on a substrate, said method comprising:

heating said substrate to a temperature lower than 400° C., introducing vapors of a precursor of Bi oxide to said substrate, wherein said precursor of Bi oxide comprises at least one alkoxide group, said precursor decomposing at the surface of said substrate to form Bi oxide in a substantially amorphous film, said Bi oxide being deposited on the surface of said substrate by chemical vapor deposition; and converting said amorphous film into said ferroelectric Aurivillius phase film by an annealing process at about 800° C. for about 15 minutes.

76. A chemical vapor deposition method of forming a ferroelectric Aurivillius phase film comprising Bi oxide on a substrate, said method comprising:

dissolving a precursor of Bi oxide in a solution comprising at least one Lewis base ligand, wherein said precursor of Bi oxide comprises at least one alkoxide group;

vaporizing said precursor of Bi oxide to form Bi oxide precursor vapor;

depositing said Bi oxide on said substrate by chemical vapor deposition from said Bi oxide precursor vapor at a temperature lower than 400° C. to form a substantially amorphous film; and annealing said amorphous film for a sufficient time and at a sufficient temperature to convert said amorphous film to said ferroelectric Aurivillius phase film.

77. A chemical vapor deposition method of forming a ferroelectric Aurivillius phase film comprising Bi oxide on a substrate, said method comprising:

dissolving a precursor of Bi oxide in a solution, wherein said precursor of Bi oxide comprises at least one alkoxide group;

vaporizing said precursor of Bi oxide at a temperature that is between 130° C. to 220° C., to form Bi oxide precursor vapor;

depositing said Bi oxide on said substrate by chemical vapor deposition from said Bi oxide precursor vapor at a temperature lower than 400° C. to form a substantially amorphous film; and annealing said amorphous film for a sufficient time and at a sufficient temperature to convert said amorphous film to said ferroelectric Aurivillius phase film.

* * * * *